United States Patent
Lin et al.

(10) Patent No.: US 9,679,862 B2
(45) Date of Patent: Jun. 13, 2017

(54) SEMICONDUCTOR DEVICE HAVING CONDUCTIVE BUMPS OF VARYING HEIGHTS

(71) Applicant: TAIWAN SEMICONDUCTOR MANUFACTURING COMPANY LTD., Hsinchu (TW)

(72) Inventors: Yen-Liang Lin, Taichung (TW); Tin-Hao Kuo, Hsinchu (TW); Sheng-Yu Wu, Hsinchu (TW); Chen-Shien Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/555,959

(22) Filed: Nov. 28, 2014

(65) Prior Publication Data

US 2016/0155715 A1     Jun. 2, 2016

(51) Int. Cl.
*H01L 23/49* (2006.01)
*H01L 23/00* (2006.01)
(Continued)

(52) U.S. Cl.
CPC .......... *H01L 24/17* (2013.01); *H01L 21/4846* (2013.01); *H01L 23/49827* (2013.01);
(Continued)

(58) Field of Classification Search
CPC .......... H01L 24/17; H01L 24/03; H01L 24/11; H01L 24/81; H01L 23/49811; H01L 23/49838; H01L 23/49866
See application file for complete search history.

(56) References Cited

U.S. PATENT DOCUMENTS

| | | | |
|---|---|---|---|
| 4,897,918 A * | 2/1990 | Osaka | H01L 23/5385 257/E21.511 |
| 6,214,644 B1 * | 4/2001 | Glenn | B81B 7/0077 257/E21.503 |

(Continued)

FOREIGN PATENT DOCUMENTS

KR     20110108222 A     10/2011

OTHER PUBLICATIONS

Office Action and its English translation dated Nov. 14, 2016 issued by the Korean Intellectual Property Office for Korean application No. 10-2015-0147483.

(Continued)

*Primary Examiner* — Ida M Soward
(74) *Attorney, Agent, or Firm* — WPAT, P.C., Intellectual Property Attorneys; Anthony King

(57) ABSTRACT

A semiconductor structure and a method for forming the same are provided. The semiconductor structure includes a substrate including a plurality of conductive traces and a semiconductor chip. The semiconductor chip includes a surface facing the plurality of conductive traces and a plurality of conductive pads on the surface and correspondingly electrically connected with the plurality of conductive traces through a plurality of conductive bumps. A height of each of the plurality of conductive bumps is determined by a minimum distance between the plurality of conductive pads and the corresponding conductive traces thereof.

20 Claims, 11 Drawing Sheets

(51) Int. Cl.
*H01L 21/48* (2006.01)
*H01L 23/498* (2006.01)

(52) U.S. Cl.
CPC .............. *H01L 24/03* (2013.01); *H01L 24/11* (2013.01); *H01L 24/81* (2013.01); *H01L 23/49816* (2013.01); *H01L 23/49838* (2013.01); *H01L 2224/11462* (2013.01); *H01L 2224/13005* (2013.01); *H01L 2224/13147* (2013.01); *H01L 2224/1403* (2013.01); *H01L 2224/16227* (2013.01); *H01L 2224/81191* (2013.01); *H01L 2224/81815* (2013.01); *H01L 2924/15724* (2013.01); *H01L 2924/15747* (2013.01)

(56) References Cited

U.S. PATENT DOCUMENTS

| | | | | |
|---|---|---|---|---|
| 6,437,584 | B1* | 8/2002 | Gleason | G01R 1/06711 324/754.2 |
| 6,939,746 | B2* | 9/2005 | Bolken | H01L 21/563 257/686 |
| 7,023,077 | B2* | 4/2006 | Madrid | H01L 21/4846 257/678 |
| 7,453,157 | B2* | 11/2008 | Haba | H01L 23/3128 174/522 |
| 7,605,374 | B2* | 10/2009 | Hoggatt | G01T 1/2018 250/368 |
| 7,696,006 | B1* | 4/2010 | Hoang | H01L 23/642 257/E21.503 |
| 8,174,129 | B2* | 5/2012 | Lu | H01L 23/147 257/738 |
| 8,420,444 | B2* | 4/2013 | Tani | H01L 24/03 438/108 |
| 8,736,065 | B2* | 5/2014 | Gonzalez | H01L 24/19 257/686 |
| 8,884,431 | B2* | 11/2014 | Lin | H01L 23/49816 257/686 |
| 9,048,168 | B2* | 6/2015 | Kwon | H01L 23/49816 |
| 9,137,903 | B2* | 9/2015 | Kang | H05K 1/113 |
| 2004/0212071 | A1* | 10/2004 | Moshayedi | H01L 25/0657 257/686 |
| 2007/0077677 | A1* | 4/2007 | Haba | G01R 1/0735 438/51 |
| 2007/0228406 | A1* | 10/2007 | Wang | H01L 24/11 257/99 |
| 2011/0100692 | A1* | 5/2011 | Topacio | H05K 3/3436 174/260 |
| 2012/0155055 | A1 | 6/2012 | Kang et al. | |
| 2012/0267751 | A1* | 10/2012 | Haba | H01L 21/486 257/499 |
| 2012/0313240 | A1* | 12/2012 | Cheng | H01L 23/49822 257/737 |
| 2013/0299977 | A1* | 11/2013 | Dayringer | H01L 25/0652 257/738 |
| 2014/0124917 | A1* | 5/2014 | Lee | H01L 24/14 257/737 |
| 2014/0264835 | A1* | 9/2014 | Wang | H01L 23/49811 257/737 |
| 2015/0008575 | A1* | 1/2015 | Liu | H01L 24/81 257/737 |
| 2015/0008578 | A1* | 1/2015 | Hlad | H01L 24/16 257/737 |
| 2015/0054167 | A1* | 2/2015 | Pendse | H01L 24/03 257/773 |
| 2015/0097277 | A1* | 4/2015 | Chen | H01L 23/3135 257/668 |
| 2015/0111344 | A1* | 4/2015 | Gallegos | H01L 23/3128 438/119 |
| 2015/0123690 | A1* | 5/2015 | Kung | G01R 1/07314 324/756.03 |
| 2015/0236002 | A1* | 8/2015 | Haba | H01L 25/18 257/713 |
| 2015/0237713 | A1* | 8/2015 | Elsherbini | H01L 23/552 361/679.55 |
| 2015/0243620 | A1* | 8/2015 | Lin | H01L 24/14 257/737 |
| 2015/0255411 | A1* | 9/2015 | Karhade | G06F 1/1686 361/679.55 |
| 2016/0043051 | A1* | 2/2016 | Lin | H01L 24/17 257/737 |
| 2016/0085899 | A1* | 3/2016 | Qian | G06F 17/5077 257/774 |

OTHER PUBLICATIONS

US counterpart application of KR20110108222 as the translation thereof, Oct. 5, 2011.

* cited by examiner

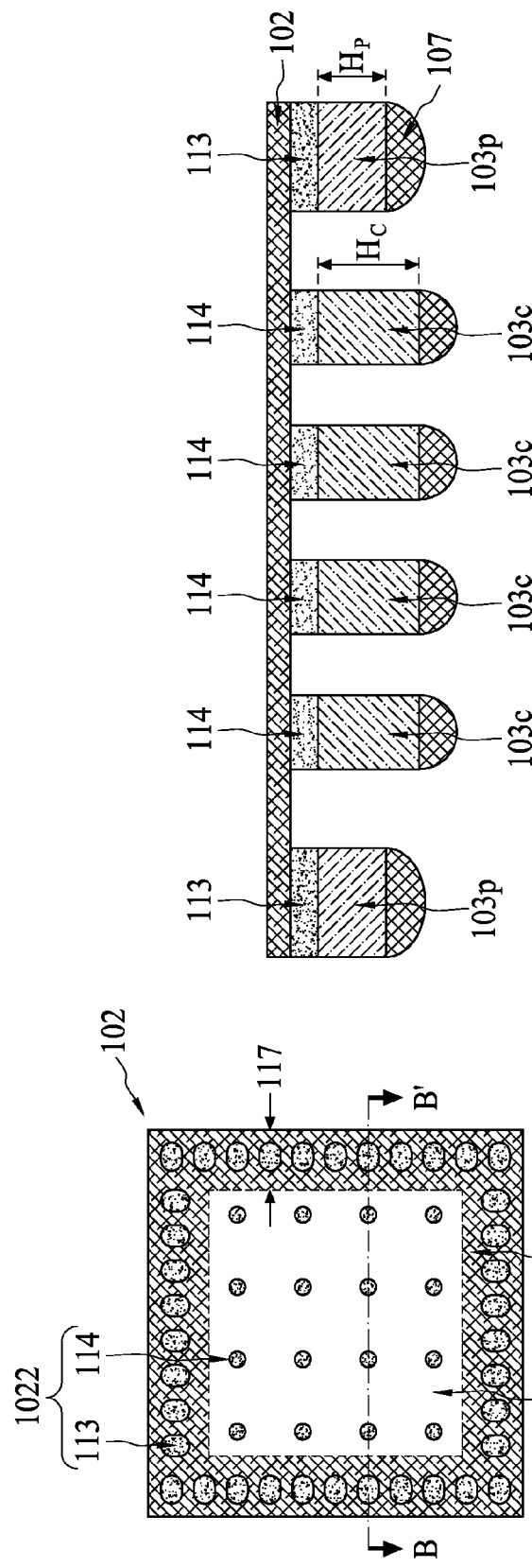

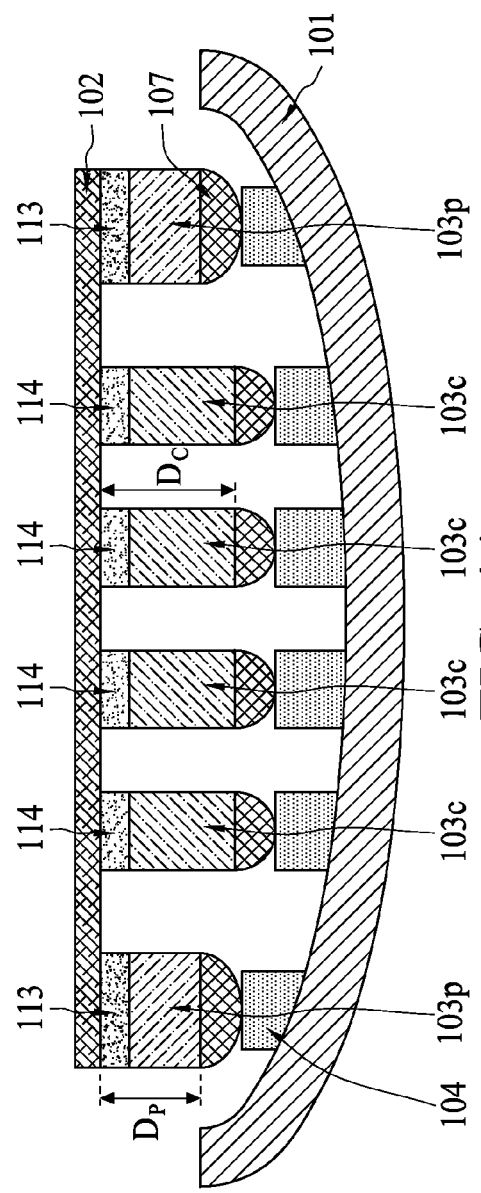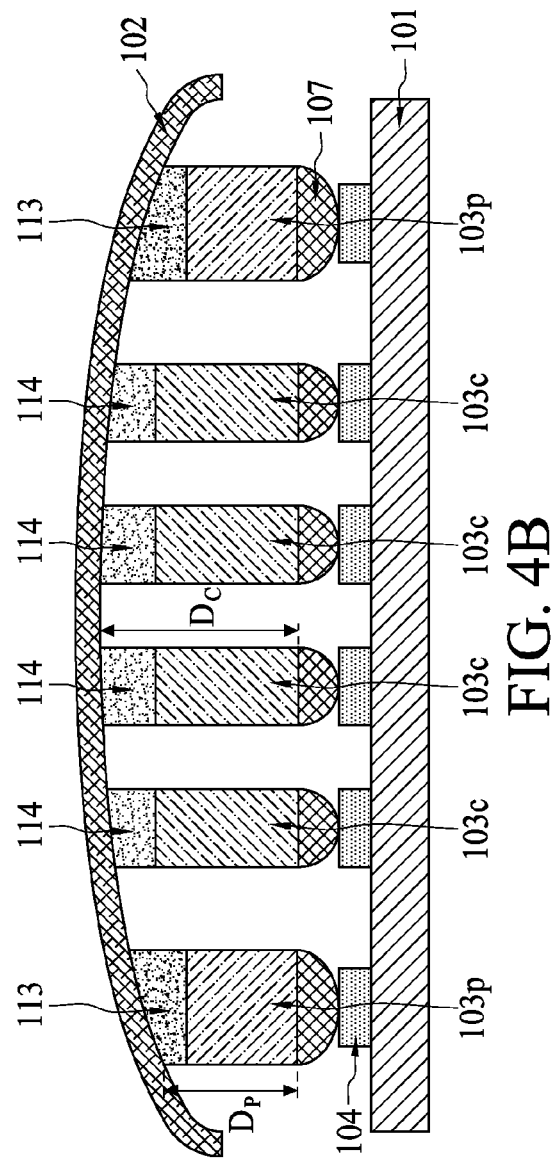

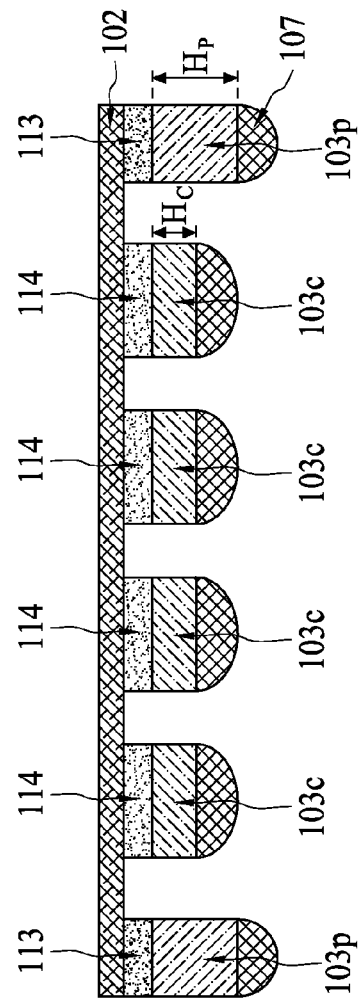
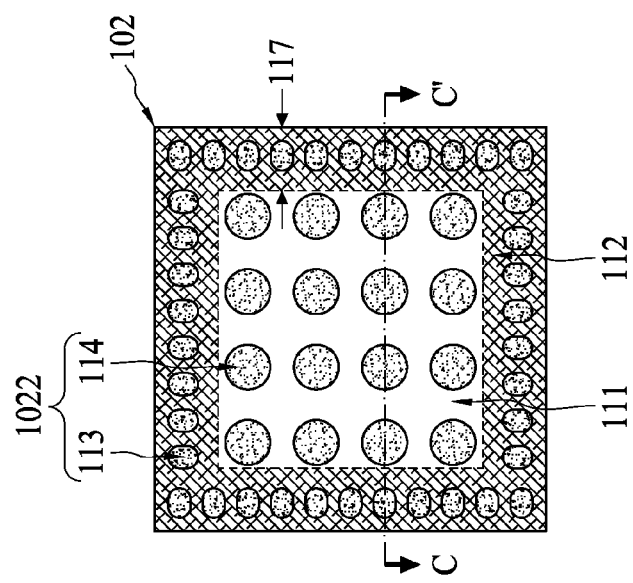
FIG. 5A
FIG. 5B

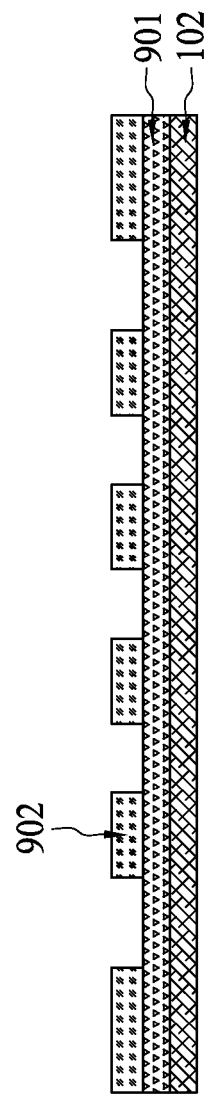
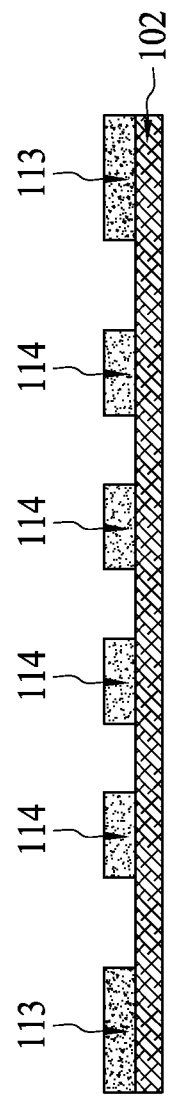
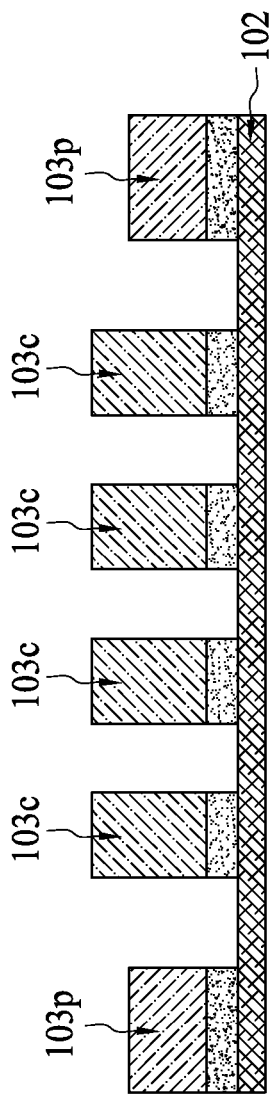
FIG. 9A
FIG. 9B
FIG. 9C
FIG. 9D

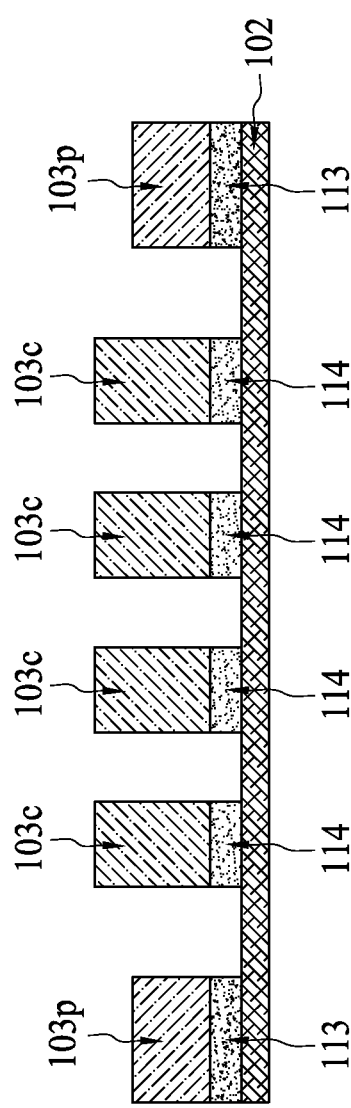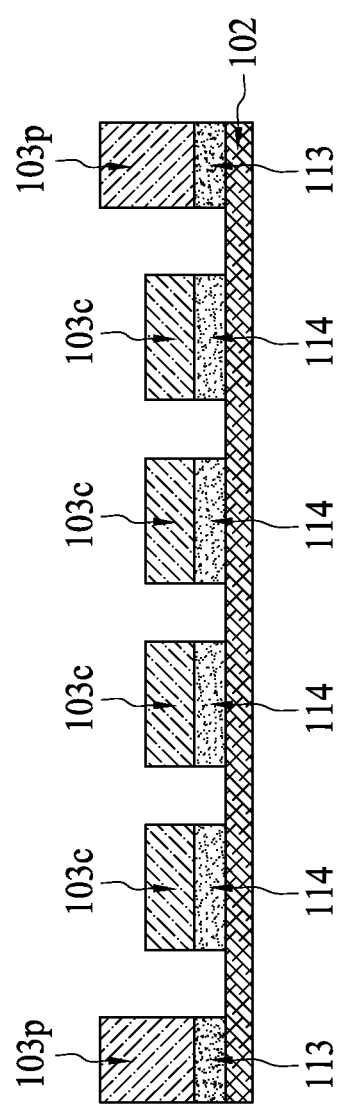

SEMICONDUCTOR DEVICE HAVING CONDUCTIVE BUMPS OF VARYING HEIGHTS

FIELD

The present disclosure relates generally to a semiconductor structure and more particularly to a Bump-on-Trace (BOT) semiconductor structure.

BACKGROUND

Because of the invention of integrated circuits, the semiconductor industry has experienced continuous rapid growth due to constant improvements in the integration density of various electronic components (i.e., transistors, diodes, resistors, capacitors, etc.) and semiconductor packages. For the most part, these improvements in integration density have come from repeated reductions in minimum feature size, allowing more components to be integrated into a semiconductor chip or package.

One approach for allowing more components to be integrated into a semiconductor package is the adoption of Bump-on-Trace (BOT) structures. BOT structures are used in flip chip packages, wherein metal bumps (for supporting device dies) directly land on metal traces of package substrates instead of being disposed on metal pads that have greater widths than the metal traces. The advantages of BOT structures include a smaller chip area requirement and low manufacturing cost.

For BOT structures, the mismatch between the coefficient of thermal expansions (CTE) of the semiconductor chip and the package substrate may result in stress on the metal traces, causing the metal traces to peel off from the package substrate. In addition, for BOT structures with finer bump pitches (the distance between adjacent bonding bumps), since the width of the conductive traces decreases, the bonding force between conductive traces and the package substrate is smaller, which also causes the peeling off of the metal traces. In view of the above, there is a need to solve the aforementioned problems, as well as other deficiencies in conventional BOT structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is an exemplary sketch diagram of the semiconductor chip in accordance with some embodiments.

FIG. 3B is a cross-sectional view illustrating a semiconductor chip in accordance with FIG. 3A of the present disclosure.

FIGS. 4A and 4B are cross-sectional views illustrating a semiconductor chip in accordance with some embodiments.

FIG. 5A is an exemplary sketch diagram of the semiconductor chip in accordance with some embodiments.

FIG. 5B is a cross-sectional view illustrating a semiconductor chip in accordance with FIG. 5A of the present disclosure.

FIGS. 9A-9F schematically illustrate a method of manufacturing a semiconductor structure in accordance with FIGS. 8D and 8E of the present disclosure.

DETAILED DESCRIPTION

Figure 1:
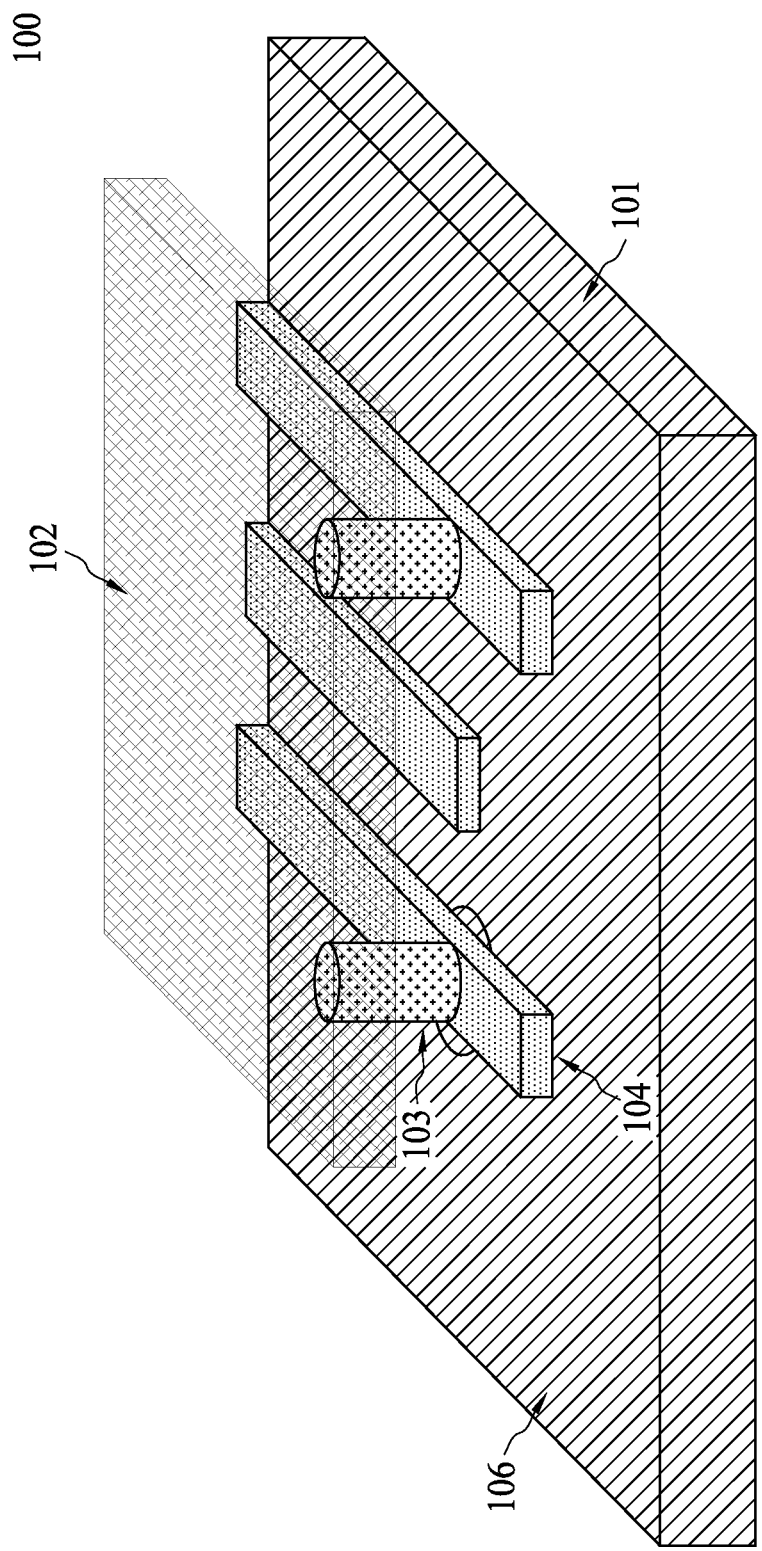
FIG. 1 is a schematic diagram illustrating a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the growing demand for finer pitches in advanced device packaging, conductive Bump-on-Trace (BOT) semiconductor structures are increasingly popular. However, as CTEs of a substrate and a semiconductor chip of a semiconductor structure are different, the bending condition of the substrate and the semiconductor are thus different, resulting in the risk of cold joints between the substrate and the semiconductor chip. In order to address the aforementioned problem, the present disclosure provides a semiconductor structure, wherein a height of conductive bumps electrically connecting a substrate and a semiconductor chip of the semiconductor structure can be altered so as to avoid cold joints during the process of manufacturing the semiconductor structure.

In reference to the drawings, FIG. 1 is a schematic diagram illustrating a semiconductor structure 100 in accordance with some embodiments. The semiconductor structure 100 includes a substrate 101, a semiconductor chip 102, a conductive bump 103 and a conductive trace 104 provided on a surface 106 of the substrate 101. The conductive trace 104 directly overlies the substrate 101. In some embodiments, the substrate comprises a printed circuit board (PCB).

Figure 1A:
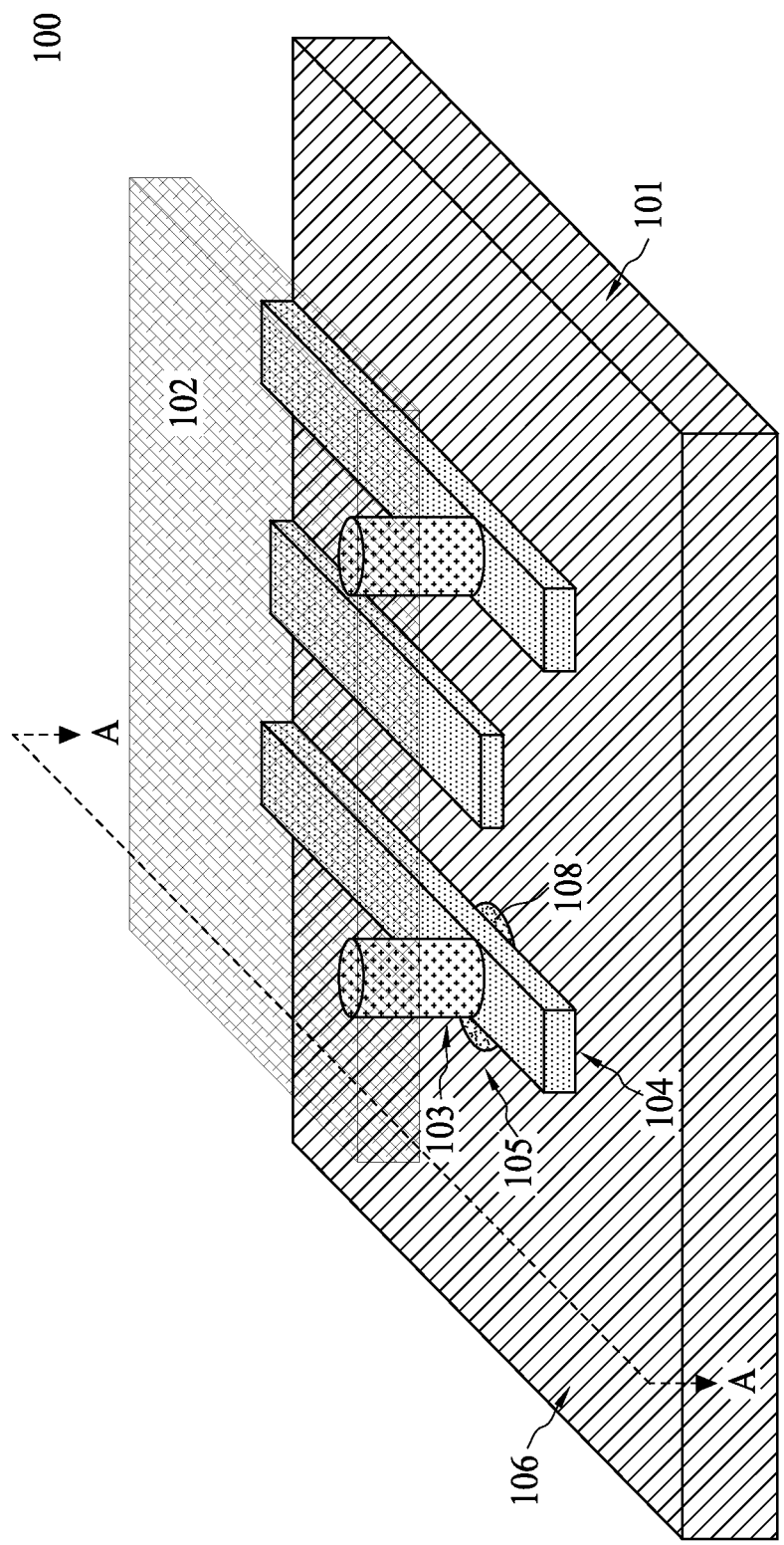
FIG. 1A is a schematic diagram illustrating a semiconductor structure in accordance with some embodiments.

In reference to the drawings, FIG. 1A is a schematic diagram illustrating a semiconductor structure 100 in accordance with some embodiments of the present disclosure. The semiconductor structure 100 includes a substrate 101, a semiconductor chip 102, a conductive bump 103, a conductive trace 104 provided on a surface 106 of the substrate 101 and a recess 105 filled with a conductive material 108. The conductive trace 104 contacts with the recess 105.

Figure 2:
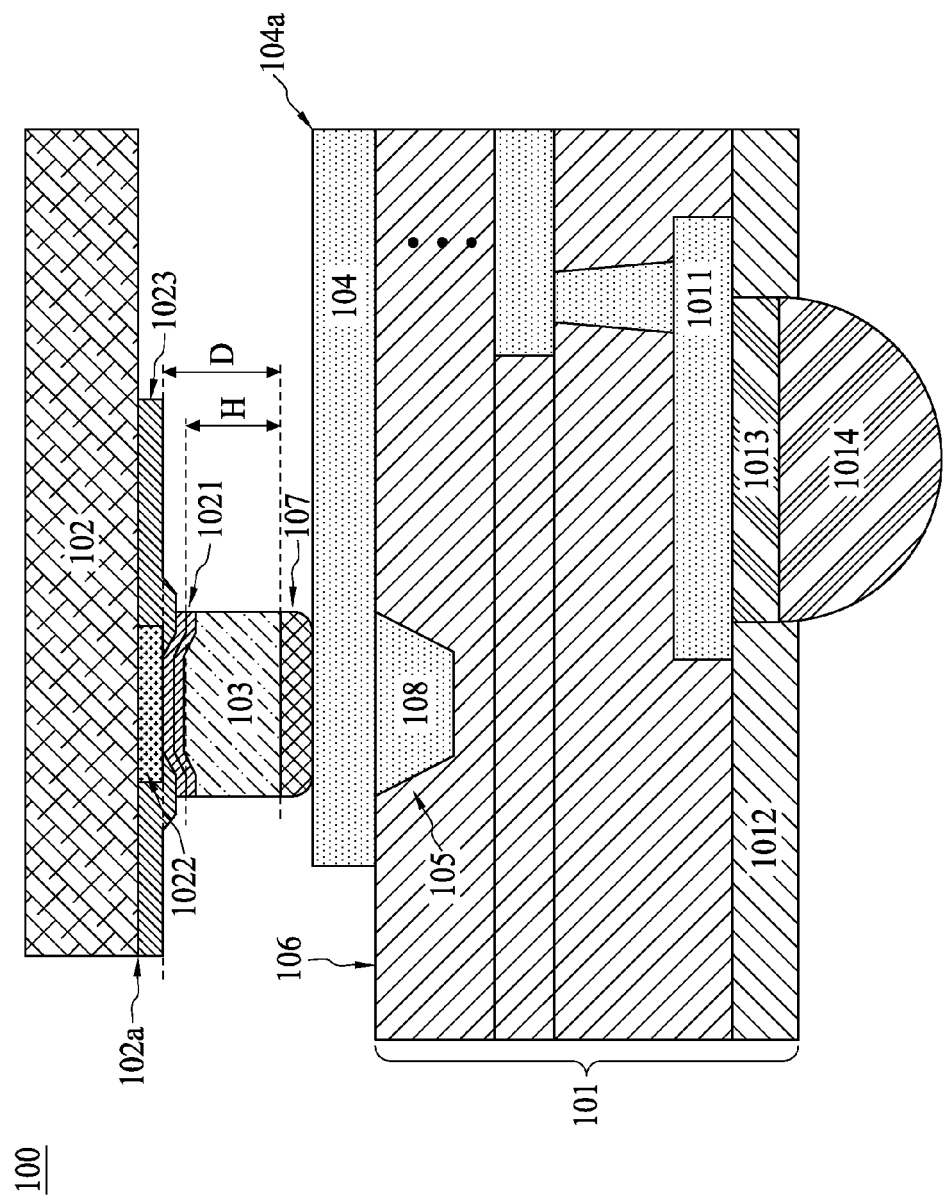
FIG. 2 is a cross-sectional view illustrating a semiconductor structure in accordance with FIG. 1A of the present disclosure.

FIG. 2 is a cross-sectional view illustrating in detail the semiconductor structure 100 of FIG. 1A of the present disclosure, wherein the exemplary cross-sectional view is obtained from the plane crossing line A-A' in FIG. 1A. The semiconductor structure 100 includes a substrate 101. The sub-substrate 101 has a recess 105 which is formed within the substrate 101 and filled with a conductive material 108. A conductive trace 104 is provided on a surface 106 of the substrate 101 and is arranged such that it directly overlies the substrate 101 and contacts the conductive material 108 within the recess 105. The conductive material 108 may be formed of the same material as the conductive trace 104. The conductive bump 103 provides an electrical path and a mechanical connection within the semiconductor structure 100. The conductive bump 103 is electrically connected to the conductive trace 104 with a conductor 107 and is disposed proximal to and over the recess 105 of the substrate 101. In some embodiments, the conductor 107 may be made of a lead-free solder, a eutectic solder, or the like. The semiconductor chip 102 is electrically connected to the conductive bump 103, namely the semiconductor chip 102 and the conductive trace 104 are electrically connected by the conductive bump 103.

In some embodiments, the semiconductor chip 102 is connected to the substrate 101 through conductive bumps 103 in a flip-chip configuration (also as known as a controlled collapse chip connection or C4). Compared with conventional packaging techniques, such as wire bonding and tape automatic bonding (TAB), a flip-chip package has a shorter signal transmission path between the semiconductor chip and the substrate, thus providing better electrical properties. In addition, a flip-chip package may be designed to expose the back surface of the semiconductor chip (the surface not facing the substrate) so as to increase the heat dissipation rate. In some embodiments the semiconductor structure 100 may be a semiconductor package which provides protection against impact and corrosion and dissipates heat produced in the semiconductor chip.

The semiconductor chip 102 may comprise logic devices, an eFlash device, a memory device, microelectromechanical (MEMS) devices, analog devices, CMOS devices, combinations of these devices, or the like. In some embodiments, the semiconductor chip 102 is connected to the conductive bump 103 at a surface 102a in the following manners. First, a conductive pad 1022 and a passivation layer 1023 (which is generally made of a polyimide material) are formed sequentially on the semiconductor chip 102. The passivation layer 1023 exposes a portion of the conductive pad 1022. An under conductive bump metallurgy (UBM) structure 1021 is then formed over the exposed portion of the conductive pad 1022 and the passivation layer 1023. At the final operation, the conductive bump 103 is connected to the UBM structure 1021, thereby electrically connecting the semiconductor chip 102 and conductive bump 103.

In some embodiments, the UBM structure 1021 comprises a metallic adhesive layer forming on the conductive pad 1022, a barrier layer for preventing diffusion, and a solder wettable layer for connecting the conductive bump 103. The UBM structure 1021 provides functions, such as a conductive bump connection, diffusion barrier, proper adhesion and so on between the conductive bump 103 and the conductive pad 1022 of the semiconductor chip 102, such that a solder material can be applied to the UBM structure 1021 and is then subjected to a reflow process to form the required conductive bump 103. The UBM structure 1021 usually comprises titanium-copper-nickel (Ti—Cu—Ni) metallic layers, and can be fabricated by, for example, sputtering, evaporation, plating and so on.

The substrate 101 may comprise bulk silicon that is doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. In some embodiments, the substrate 101 includes multi-layered substrates, gradient substrates, hybrid orientation substrates, any combinations thereof and/or the like, such that the semiconductor package can accommodate more active and passive components and circuits. In some embodiments, the substrate 101 may be formed using multiple epoxy-containing insulative layers with through-holes that are filled with conductive plugs or filler material. Multiple level metallization structures 1011 (e.g., conductive plugs, filler materials or conductive traces formed within the multiple epoxy-containing insulative layers) are provided to form a conductive path in the vertical directions. In some embodiments, a solder mask 1012 is positioned on the bottom surface of the substrate 101, which surrounds a ball land 1013 that is configured to receive an external terminal, such as a solder ball 1014, provided for creating the external connectors of the semiconductor structure.

The conductive trace 104 is provided on the surface 106 of the substrate 101 to form a pattern of electronic connections. The conductive trace 104 may be formed of substantially pure copper, aluminum copper, or other metallic materials such as tungsten, nickel, palladium, gold, and/or alloys thereof. Compared with conventional bonding techniques, the present disclosure adopts the conductive Bump-on-Trace (BOT) structure, in which the conductive bump 103 are directly disposed on the conductive trace 104 instead of being disposed on bonding pads (conventional approach) that have greater widths than the those of the conductive trace 104, thereby reducing the required chip area and conductive bump pitch.

In some embodiments, a conductive bump 103 is provided as the bonding element such that the conductive bump 103 is disposed on the conductive trace 104, in place of conventional solder conductive bumps. Namely, the semiconductor chip 102 is connected to conductive trace 104 by the conductive bump 103. The conductive bump 103 provides both an electrical conduction path and a thermal conduction path between the semiconductor chip 102 and the substrate 101. The conductive bump 103 of the present disclosure can be a prism or a cylinder. It should be noted that the melting point of the conductive bump 103 is higher than the fusion temperature of the conductor 107.

In some embodiments, the conductive bump 103 is made of metal. In some embodiments, the material of the conductive bump 103 is selected from tin, lead, copper, gold, silver, zinc, bismuth, magnesium, antimony, indium and an alloy thereof. Using copper as the material for the conductive bump 103 has the following advantages: compared with conventional solder conductive bump techniques, using copper bumps as the bonding elements not only helps achieve finer pitch with minimum probability of conductive bump bridging but also reduces the capacitance load for the circuits (electronic interconnections). Copper bumps offer higher reliability, and improved electrical and thermal performance. While conventional solder conductive bumps collapse during solder reflow, copper bumps retain their shape.

The conductive bump 103 has a height H which is measured from the interface between the conductive bump 103 and the UBM structure 1021 to the interface between the conductive bump 103 and conductor 107. UBM 1021 is optional for some embodiments, for embodiments without UBM 1021, the height H is measured from the interface between the conductive bump 103 and conductive pad 1022. In some embodiments, the height H can be adjusted by changing the area size of UBM structure 1021 or conductive pad 1022.

FIGS. 3A and 5A are exemplary sketch diagrams of the semiconductor chip 102 comprising several conductive pads 1022, wherein the conductive pads 1022 are distributed partially in a core region 111 of the semiconductor chip 102 and partially in a periphery region 112 of the semiconductor chip 102. The periphery region 112 is a region surrounding edges of the semiconductor chip 102 with a width 117 of about 6 times that of a minimum conductive bump pitch. The core region 111 is the region of the semiconductor chip 102 surrounded by the periphery region 112. The distance between conductive pads 114 in the core region 111 is greater than those between conductive pads 113 in the periphery region 112.

FIG. 3B is a cross-sectional view illustrating in detail the semiconductor chip 102 of FIG. 3A of the present disclosure, wherein the exemplary cross-sectional view is obtained from the plane crossing line B-B' in FIG. 3A. Some conductive bumps 103p are mounted on some conductive pads 113 in the periphery region 112 of the semiconductor chip 102. Some conductive bumps 103c are mounted on some conductive pads 114 in the core region 111 of the semiconductor chip 102. The conductive bumps 103 connect the semiconductor chip 102 to the substrate 101 via the conductors 107. For simplicity, the conductors 107 are omitted to be shown in FIG. 3A. In some embodiments, the area of each of the conductive bumps 103c in the core region 111 of the semiconductor chip 102 is smaller than that of each of the conductive bumps 103p in the periphery region 112 of the semiconductor chip 102. Under such circumstance, a height of the conductive bumps 103c in the core region 111 is greater than that of the conductive bumps 103p in the periphery region 112. In some embodiments, the ratio between the area of the conductive bumps 103p in the periphery region 112 and that of the conductive bumps 103c in the core region 111 are between about 1.1 and about 2.67. The limitation of the ratio between the area of the conductive bumps 103p in the periphery region 112 and that of the conductive bumps 103c in the core region 111 is determined by multiple actual substrate warpages and in consideration of the process for manufacturing bumps.

Referring back to FIG. 2, the height H of the conductive bump 103 is determined by a minimum distance D between the conductive pad 1022 and a top surface 104a of the corresponding conductive trace 104. In some embodiments, the height H of the conductive bump 103 is designed to be in proportional to the minimum distance D. A positive factor $\alpha$ is predefined to show the dependence between D and H, and a correlation between D and H is expressed as $H=\alpha \times D$, wherein $\alpha$ is greater than 0 and smaller than 1.

For example (without UBM structure implemented), as in FIG. 3B, the height $H_p$ of the conductive bumps 103p is determined by a minimum distance between the conductive pads 113 and its corresponding conductive trace 104. Similarly, the height $H_c$ of the conductive bumps 103c is also determined by a minimum distance between the conductive pads 114 and its corresponding conductive trace 104. Because the height $H_p$ is required to be smaller than the height $H_c$, the conductive pads 113 in the periphery region 112 are given a greater pad size than the conductive pads 114 in the core region 111.

For examples as in FIG. 2, the semiconductor chip 102 and the substrate 101 are considered as substantially parallel to each other, therefore height $H_p$ may be substantially equal to height $H_c$. Therefore, the area size of the UBM structure 1021 (or conductive pad) in the core region 111 is substantially equal to that in the periphery region 112.

For some embodiments, the substrate 101 and the semiconductor chip 102 are not arranged in a parallel manner as in FIG. 2. For an example as shown in FIG. 4A, the substrate 101 bends but the semiconductor chip 102 does not bend. However, the design rule ($H=\alpha \times D$) applied in the aforementioned examples can be adopted as well. The flat semiconductor chip 102 is connected to a substrate 101 with concaved top surface. Therefore, the semiconductor chip 102 is closer to the substrate 101 at its edge, or says its periphery region. The minimum distance $D_p$ between the conductive pads 113 in the periphery region 112 and the substrate 101 is smaller than that ($D_c$) of the conductive pads 114 in the core region 111. The area size of conductive pads 113 is designed to be greater than that of the conductive pads 114. Thus, the conductive bumps 103c in the core region 111 are grown to have a greater height than that of the conductive bumps 103p in the periphery region 112. Moreover, since the substrate 101 is bended, it is possible that the minimum distance of each conductive pad 114 in the core region 111 may be different. For example, the conductive pad closer to the center of the core region 111 is more distal to the substrate 101 compared to the conductive pad closer to the edge of the core region 111.

In some embodiments, the semiconductor chip 102 bends but the substrate 101 does not bend as shown in FIG. 4B. However, the design rule ($H=\alpha \times D$) applied in the aforementioned examples still can be adopted as well. The flat substrate 101 is connected to a semiconductor chip 102 with convex top surface such that the semiconductor chip 102 is closer to the substrate 101 at its periphery region. The minimum distance $D_p$ between the conductive pads 113 in the periphery region 112 and the substrate 101 is smaller than that ($D_c$) of the conductive pads 114 in the core region 111. The area size of conductive pads 113 is designed to be larger than that of the conductive pads 114. Thus, the conductive bumps 103c in the core region 111 are grown to have a greater height than that of the conductive bumps 103p in the periphery region 112. Moreover, since the semiconductor chip 102 is bended, it is possible that the minimum distance of each conductive pad 114 in the core region 111 may be different. For example, the conductive pad closer to the center of the core region 111 is more distal to the substrate 101 compared to the conductive pad closer to the edge of the core region 111. With the adjusted heights based on the minimum distance D, all the conductive bumps of the semiconductor chip 102 are electrically connected to the substrate 101. Therefore, a cold joint can be avoided.

FIG. 5B is a cross-sectional view illustrating in detail the semiconductor chip 102 of FIG. 5A of the present disclosure, wherein the exemplary cross-sectional view is obtained from the plane crossing line C-C' in FIG. 5A. Some conductive bumps 103p are mounted on conductive pads 113 in the periphery region 112 of the semiconductor chip 102. Some conductive bumps 103c are mounted on conductive pads 114 in the core region 111 of the semiconductor chip 102. The conductive bumps 103 connect the semiconductor chip 102 to the substrate 101 via the conductors 107. For simplicity, the conductors 107 are omitted to be shown in FIG. 5A. In some embodiments, the area of each of the conductive bumps 103c in the core region 111 is greater than that of each of the conductive bumps 103p in the periphery region 112. Under such circumstance, a height of the conductive bumps 103c in the core region 111 is less than that of the conductive bumps 103p in the periphery region 112. In some embodiments, the ratio between the area of the conductive bumps 103p in the periphery region 112 and that of the conductive bumps 103c in the core region 111 are between about 0.17 and about 0.91. The limitation of the ratio between the area of the conductive bumps 103p in the periphery region 112 and that of the conductive bumps 103c in the core region 111 is determined by multiple actual substrate warpages and in consideration of the process for manufacturing bumps.

Figure 6A:
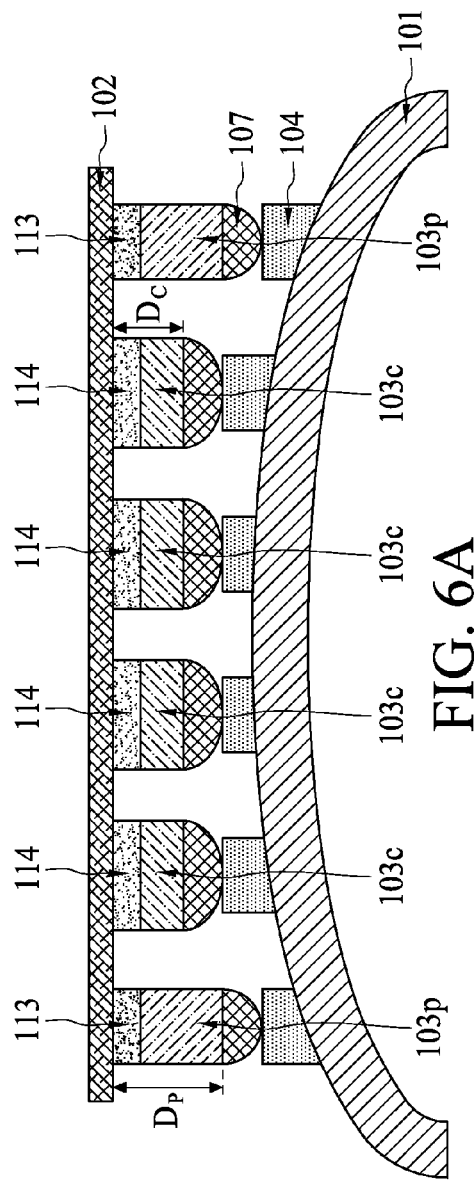
FIGS. 6A and 6B are cross-sectional views illustrating a semiconductor chip in accordance with some embodiments.

In some embodiments, the substrate 101 bends but the semiconductor chip 102 does not bend as shown in FIG. 6A. The design rule (H=α×D) applied in the aforementioned examples still can be adopted as well. The flat semiconductor chip 102 is connected to a substrate 101 with convex top surface. Therefore, the semiconductor chip 102 is closer to the substrate 101 at its center, or says its core region. The minimum distance $D_p$ between the conductive pads 113 and the substrate 101 is greater than that ($D_c$) of the conductive pads 114 in the core region 111. The area size of conductive pads 113 is designed to be smaller than that of the conductive pads 114. Thus, the conductive bumps 103c in the core region 111 are designed to have a smaller height than that of the conductive bumps 103p in the periphery region 112. Moreover, since the substrate 101 is bended, it is possible that the minimum distance of each conductive pad 114 in the core region 111 may be different. For example, the conductive pad closer to the edge of the core region 111 is more distal to the substrate 101 compared to the conductive pad closer to the center of the core region 111. The conductive bumps are designed to have different heights such that all the conductive bumps of the semiconductor chip 102 are electrically connected to the substrate 101.

Figure 6B:
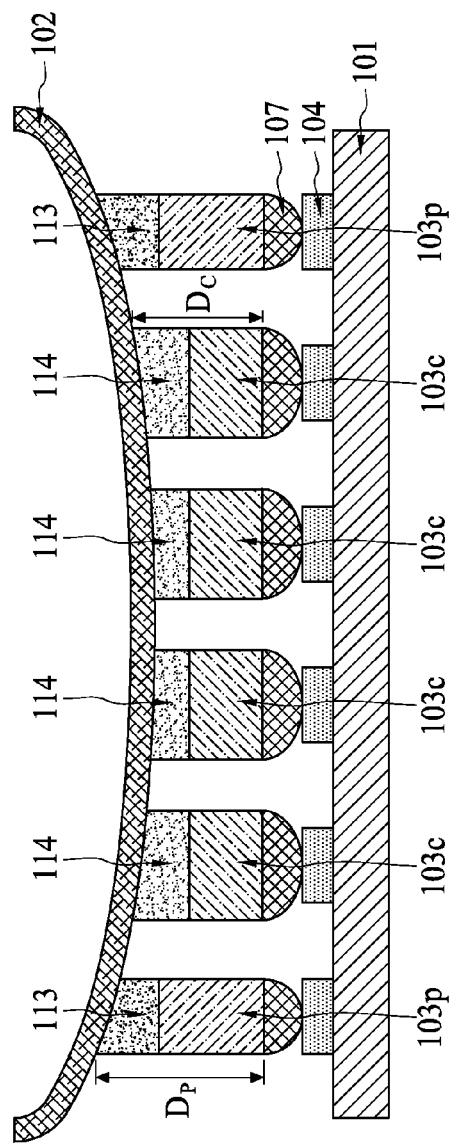

In some embodiments, the semiconductor chip 102 bends but the substrate 101 does not bend as shown in FIG. 6B. The design rule (H=α×D) applied in the aforementioned examples can be still adopted as well. The flat substrate 101 is connected to a semiconductor chip 102 with concaved top surface. Therefore, the semiconductor chip 102 is closer to the substrate 101 at its core region. The minimum distance $D_p$ between the conductive pads 113 and the substrate 101 is greater than that ($D_c$) of the conductive pads 114 in the core region 111. The area size of conductive pads 113 is designed to be smaller than that of the conductive pads 114. Thus, the conductive bumps 103c in the core region 111 are designed to have a smaller height than that of the conductive bumps 103p in the periphery region 112. Moreover, since the semiconductor chip 102 is bended, it is possible that the minimum distance of each conductive pad 114 in the core region 111 may be different. For example, the conductive pad closer to the edge of the core region 111 is more distal to the substrate 101 compared to the conductive pad closer to the center of the core region 111. With the adjusted heights based on the minimum distance D, all the conductive bumps of the semiconductor chip 102 are electrically connected to the substrate 101. Therefore, a cold joint can be avoided.

Figure 7:
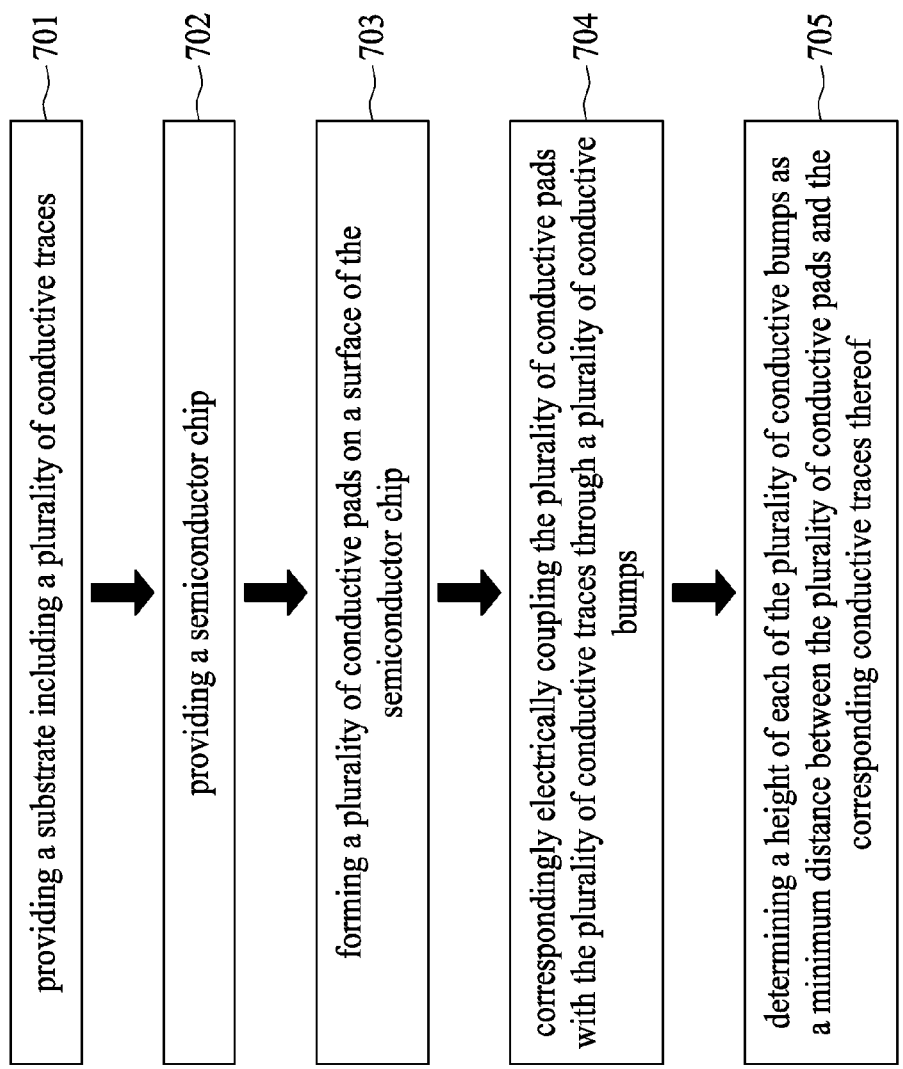
FIG. 7 represents a flow chart of manufacturing a semiconductor structure in accordance with some embodiments.

FIG. 7 is a flowchart of a method of manufacturing a semiconductor structure as shown in FIG. 1. In operation 701, a substrate 101, including a conductive trace 104, is provided. In operation 702, a semiconductor chip 102 is provided. In operation 703, a conductive pad is formed on a surface of the semiconductor chip 102. In operation 704, the conductive pad is correspondingly electrically coupled with the conductive trace 104 through a conductive bump 103. In operation 705, a height of the conductive bump 103 is determined as a minimum distance between the conductive pad and the corresponding conductive trace 104 thereof.

Figure 8E:
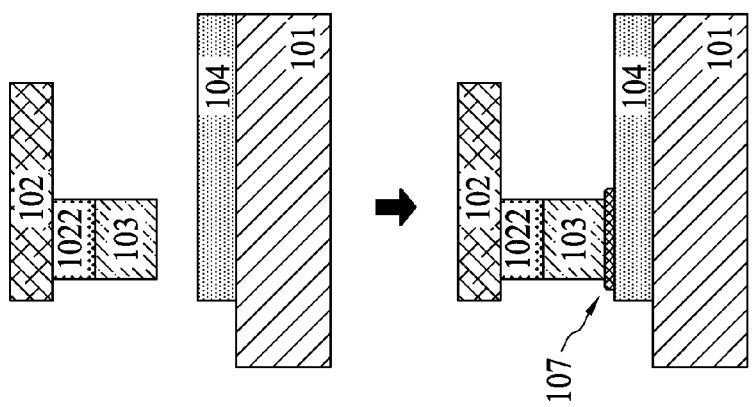
FIGS. 8A-8F represents a flow of manufacturing a semiconductor structure in accordance with FIG. 7 of the present disclosure.
Figure 8F:
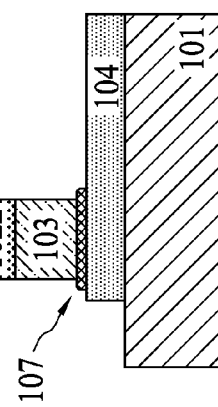
Figure 8A:
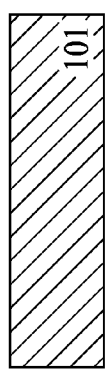
Figure 8B:
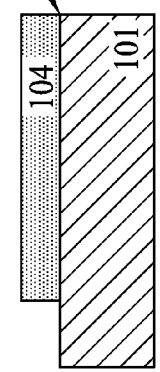
Figure 8C:
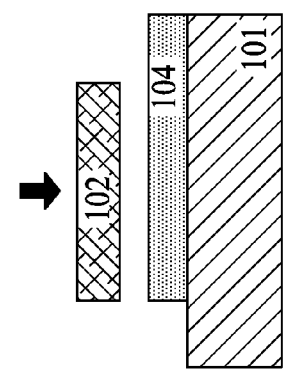
Figure 8D:
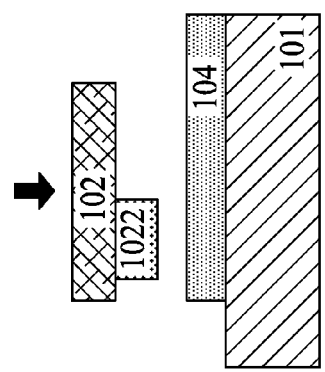

FIGS. 8A-8F schematically illustrate operations of the method of FIG. 7. In FIG. 8A, a substrate 101 is provided. In FIG. 8B, a conductive trace 104 is formed on a surface 106 of the substrate 101, wherein the conductive trace 104 directly overlies the substrate 101. FIGS. 8A and 8B schematically illustrate the operation 701. In FIG. 8C, a semiconductor chip 102 is provided. FIG. 8C schematically illustrates the operation 702. In FIG. 8D, a conductive pad 1022 is formed on the semiconductor chip 102. FIG. 8D schematically illustrates the operation 703. In FIG. 8E, a conductive bump 103 is formed on the conductive pad 1022. In FIG. 8F, the conductive bump 103 is electrically coupled to the conductive trace 104 (via a conductor 107) in a BOT configuration. FIGS. 8E and 8F schematically illustrate the operation 704.

There are many ways to form conductive pads on a semiconductor chip. For example, FIGS. 9A-9D schematically illustrate a method of forming a conductive pad on a semiconductor chip. In FIG. 9A, a conductive material 901 is formed on a surface 106 of a semiconductor chip 102. In FIG. 9B, a mask layer 902 is patterned and formed on the conductive material 901 to expose some portions of the conductive material 901. In FIG. 9C, the exposed portions of the conductive material 901 are etched away and the mask layer 902 is removed. The conductive material 901 forms the conductive pads 113 in the periphery region 112 and the conductive pads 114 in the core region 111 of the semiconductor chip 102. In some embodiments, the conductive bumps 103p and 103c are formed by electroplating conductive materials onto the conductive pads. The method of forming the conductive pads and the conductive bumps illustrated in FIGS. 9A-9D is not deemed as a limitation.

Within a certain time of electroplating conductive materials onto the conductive pad, the total amount of the conductive material 901 electroplated onto the conductive pad is fixed. If the area of the conductive pad is greater, the height of the corresponding conductive bump is smaller. For examples illustrated in FIG. 9E, when the area of the conductive pads 113 in the periphery region 112 is greater than that of the conductive pads 114 in the core region 111, the height of the conductive bumps 103p in the periphery region 112 is smaller than that of the conductive bumps 103c in the core region 111. for examples in illustrated FIG. 9F, when the area of the conductive pads 113 in the periphery region 112 is smaller than that of the conductive pads 114 in the core region 111, the height of the conductive bumps 103p in the periphery region 112 is greater than that of the conductive bumps 103c in the core region 111. With the adjusted areas of the conductive pads, the height of the conductive bumps of the semiconductor chip 102 can be designed for the conductive bumps to be electrically connected to the substrate 101 without a gap therebetween.

Compared to the examples illustrated in FIG. 9A-9F, some embodiments further have an extra UBM structure disposed on the conductive pad. A mask can be disposed on the conductive pads before forming the UBM. The pattern of the mask is designed to have recesses with different sizes in order to form UBMs with various area sizes. Electroplating may be adopted to fill conductive material in the recesses for UBM formation. Same as the conductive pad, the height of the subsequent-formed conductive bump is also dependent on the area size of UBM where the conductive bump lands upon. The greater the UBM size is, the shorter the conductive bump thereon.

In some embodiments, conductive bumps are formed by electroplating conductive materials onto conductive pads. In some embodiments, electrically coupling the conductive pads and the conductive bumps comprises applying solder materials on the conductive bumps of the semiconductor chip and reflowing the solder materials. In some embodiments, forming the conductive bumps on the semiconductor chip comprises forming the conductive bumps correspondingly positioned over the conductive pads in the core region and the periphery region of the semiconductor chip.

Some embodiments of the present disclosure provide a semiconductor structure comprising a substrate including a plurality of conductive traces and a semiconductor chip. The semiconductor chip comprises a surface facing the plurality of conductive traces and a plurality of conductive pads on the surface and correspondingly electrically connected with the plurality of conductive traces through a plurality of conductive bumps. A height of each of the plurality of conductive bumps is determined by a minimum distance between the plurality of conductive pads and the corresponding conductive traces thereof.

Some embodiments of the present disclosure provide a semiconductor structure comprising a substrate comprising a plurality of conductive traces overlying a surface of the substrate and a semiconductor chip. The semiconductor chip is electrically connected to the plurality of conductive traces via a plurality of conductive bumps. The plurality of conductive bumps are distributed partially in a core region of the semiconductor chip and partially in a periphery region of the semiconductor chip. The plurality of conductive bumps in the core region has a different height from that of the plurality of conductive bumps in the periphery region.

Some embodiments of the present disclosure provide a method for forming a semiconductor structure. The method comprises providing a substrate including a plurality of conductive traces; providing a semiconductor chip; forming a plurality of conductive pads on a surface of the semiconductor chip; correspondingly electrically coupling the plurality of conductive pads with the plurality of conductive traces through a plurality of conductive bumps; and determining a height of each of the plurality of conductive bump as a minimum distance between the plurality of conductive pads and the corresponding conductive traces thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate including a plurality of conductive traces;
    a recess in the substrate, the recess being filled with a conductive material electrically coupled to at least one of the plurality of conductive traces; and
    a semiconductor chip comprising:
        a surface facing the plurality of conductive traces; and
        a plurality of conductive pads on the surface and correspondingly electrically connected with the plurality of conductive traces through a plurality of conductive bumps,
    wherein a height of each of the plurality of conductive bumps is determined by a minimum distance between the plurality of conductive pads and the corresponding conductive traces thereof.

2. The semiconductor structure of claim 1, wherein the plurality of conductive traces directly overlies the substrate.

3. The semiconductor structure of claim 1, wherein the plurality of conductive traces contact with recesses comprising conductive materials.

4. The semiconductor structure of claim 1, wherein the plurality of conductive bumps comprise copper or alloy thereof.

5. The semiconductor structure of claim 1, wherein the plurality of conductive traces comprise copper or aluminum-copper alloys.

6. The semiconductor structure of claim 1, wherein coefficients of thermal extension of the substrate and that of the semiconductor chip are different.

7. The semiconductor structure of claim 1, wherein the substrate comprises a printed circuit board (PCB).

8. A semiconductor structure, comprising:
    a substrate comprising a plurality of conductive traces overlying a surface of the substrate;
    a recess in the substrate, the recess being filled with a conductive material electrically coupled to at least one of the plurality of conductive traces; and
    a semiconductor chip electrically connected to the plurality of conductive traces via a plurality of conductive bumps, wherein the plurality of conductive bumps are distributed partially in a core region of the semiconductor chip and partially in a periphery region of the semiconductor chip, and the plurality of conductive bumps in the core region has a different height from that of the plurality of conductive bumps in the periphery region.

9. The semiconductor structure of claim 8, wherein the periphery region is a region surrounding edges of the semiconductor chip with a width of about 6 times that of a minimum bump pitch.

10. The semiconductor structure of claim 8, wherein the core region is the region of the semiconductor chip surrounded by the periphery region.

11. The semiconductor structure of claim 8, wherein the height of the plurality of conductive bumps in the core region is greater than that of the plurality of conductive bumps in the periphery region when an area of the plurality of conductive bumps in the core region is smaller than that of the plurality of conductive bumps in the periphery region.

12. The semiconductor structure of claim 8, wherein the height of the plurality of conductive bumps in the core region is less than that of the plurality of conductive bumps in the periphery region when an area of the plurality of conductive bumps in the core region is greater than that of the plurality of conductive bumps in the periphery region.

13. The semiconductor structure of claim 11, wherein the ratio between the area of the plurality of conductive bumps in the periphery region and that of the plurality of conductive bumps in the core region are between about 1.1 and about 2.67.

14. The semiconductor structure of claim 12, wherein the ratio between the area of the plurality of conductive bumps in the periphery region and that of the plurality of conductive bumps in the core region are between about 0.17 and about 0.91.

15. The semiconductor structure of claim 8, wherein the distance between the plurality of conductive bumps in the core region is greater than that between the plurality of conductive bumps in the periphery region.

16. A semiconductor structure, comprising:
a substrate comprising a surface;
a recess in the substrate, the recess being filled with a conductive material;
a plurality of conductive traces overlying the surface, at least one of the conductive traces electrically coupling the conductive material; and
a semiconductor chip comprising a plurality of pads electrically connected to the plurality of conductive traces via a plurality of conductive bumps, wherein the substrate and the semiconductor chip are not parallel, and a height of each of the plurality of conductive bumps is proportional to a minimum distance between the each of the plurality of conductive pads and each of the corresponding plurality of conductive traces thereof.

17. The semiconductor structure of claim 16, wherein the plurality of conductive traces directly overlies the substrate.

18. The semiconductor structure of claim 16, wherein the plurality of conductive traces contact with recesses comprising conductive materials.

19. The semiconductor structure of claim 16, wherein the plurality of conductive bumps comprise copper or alloy thereof.

20. The semiconductor structure of claim 16, wherein the plurality of conductive traces comprise copper or aluminum-copper alloys.

* * * * *